US011411550B2

(12) United States Patent
Ishino et al.

(10) Patent No.: US 11,411,550 B2
(45) Date of Patent: Aug. 9, 2022

(54) PIEZOELECTRIC RESONATOR DEVICE (71) Applicant: DAISHINKU CORPORATION, Kakogawa (JP)

(72) Inventors: Satoru Ishino, Kakogawa (JP); Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 0 days.

(21) Appl. No.: 17/289,261

(22) PCT Filed: Oct. 29, 2019

(86) PCT No.: PCT/JP2019/042285
§ 371 (c)(1),
(2) Date: Apr. 28, 2021

(87) PCT Pub. No.: WO2020/110557
PCT Pub. Date: Jun. 4, 2020

(65) Prior Publication Data
US 2021/0399715 A1 Dec. 23, 2021

(30) Foreign Application Priority Data
Nov. 26, 2018 (JP) .............................. JP2018-219893

(51) Int. Cl.
*H01L 41/053* (2006.01)
*H01L 41/083* (2006.01)
(Continued)

(52) U.S. Cl.
CPC ............. *H03H 9/19* (2013.01); *H01L 41/053* (2013.01); *H01L 41/083* (2013.01); *H01L 41/18* (2013.01);
(Continued)

(58) Field of Classification Search
CPC ...... H01L 41/053; H01L 41/083; H01L 41/18; H01L 41/31; H03B 5/30; H03B 5/32;
(Continued)

(56) References Cited

U.S. PATENT DOCUMENTS

| 6,417,574 B1* | 7/2002 | Misawa | H03H 9/725 |
| | | | 257/737 |
| 2007/0096605 A1* | 5/2007 | Fujii | H03H 3/02 |
| | | | 310/348 |
| 2012/0025672 A1* | 2/2012 | Morita | H03H 3/02 |
| | | | 29/25.35 |
| 2016/0322952 A1* | 11/2016 | Iizuka | H03H 3/02 |

(Continued)

FOREIGN PATENT DOCUMENTS

| JP | 2008-066921 A | 3/2008 |
| JP | 2010-252051 A | 11/2010 |

(Continued)

*Primary Examiner* — Levi Gannon
(74) *Attorney, Agent, or Firm* — Metrolex IP Law Group, PLLC (57) ABSTRACT

In a crystal oscillator accordance to an embodiment, a crystal resonator plate is bonded to, via laminated bonding patterns, a first sealing member covering a first excitation electrode of the crystal resonator plate; and a second sealing member covering a second excitation electrode of the crystal resonator plate. An internal space is formed, which hermetically seals a vibrating part including the first and second excitation electrodes of the crystal resonator plate. The laminated bonding patterns include a laminated sealing pattern annularly formed to surround the vibrating part in plan view so as to hermetically seal the internal space, and a laminated conductive pattern establishing conduction between wiring and electrodes. The laminated conductive pattern is disposed within a closed space surrounded by the laminated sealing pattern. To the laminated sealing pattern, GND potential is applied when the crystal oscillator operates.

3 Claims, 9 Drawing Sheets

(51) Int. Cl.
  *H03B 5/32* (2006.01)
  *H03H 9/05* (2006.01)
  *H03H 9/13* (2006.01)
  *H03H 9/19* (2006.01)
  *H01L 41/18* (2006.01)
  *H03B 5/34* (2006.01)
  *H03H 9/17* (2006.01)

(52) U.S. Cl.
  CPC ............... *H03B 5/32* (2013.01); *H03B 5/34* (2013.01); *H03H 9/0547* (2013.01); *H03H 9/131* (2013.01); *H03H 9/172* (2013.01)

(58) Field of Classification Search
  CPC . H03B 5/326; H03B 5/34; H03B 5/36; H03H 9/02; H03H 9/05; H03H 9/0514; H03H 9/0547; H03H 9/0595; H03H 9/10; H03H 9/1035; H03H 9/131; H03H 9/132; H03H 9/15; H03H 9/17; H03H 9/172; H03H 9/173; H03H 9/19
  See application file for complete search history.

(56) References Cited

U.S. PATENT DOCUMENTS

| | | | |
|---|---|---|---|
| 2016/0329484 A1* | 11/2016 | Iizuka | ............. H01L 41/31 |
| 2018/0006630 A1 | 1/2018 | Kojo | |
| 2018/0019727 A1 | 1/2018 | Ando et al. | |
| 2019/0312562 A1 | 10/2019 | Ishino | |
| 2019/0312565 A1 | 10/2019 | Kojo | |
| 2020/0044623 A1 | 2/2020 | Kojo | |

FOREIGN PATENT DOCUMENTS

| | | |
|---|---|---|
| JP | 2018-014717 A | 1/2018 |
| JP | 2018-046476 A | 3/2018 |
| JP | 2021-016184 A | 2/2021 |
| JP | 2021-036689 A | 3/2021 |
| TW | 201832467 A | 9/2018 |
| WO | 2016/121182 A1 | 8/2016 |
| WO | 2018/016467 A1 | 1/2018 |
| WO | 2018/051800 A1 | 3/2018 |
| WO | 2018/092776 A1 | 5/2018 |

* cited by examiner

PIEZOELECTRIC RESONATOR DEVICE

TECHNICAL FIELD

The present invention relates to a piezoelectric resonator device.

BACKGROUND ART

Recently, in various electronic devices, the operating frequencies have increased and the package sizes (especially, the heights) have decreased. According to such an increase in operating frequency and a reduction in package size, there is also a need for piezoelectric resonator devices (such as a crystal resonator and a crystal oscillator) to be adaptable to the increase in operating frequency and the reduction in package size.

In this kind of piezoelectric resonator devices, a housing is constituted of a package having a substantially rectangular parallelepiped shape. The package is constituted of: a first sealing member and a second sealing member both made of, for example, glass or crystal; and a piezoelectric resonator plate made of, for example, crystal. On respective main surfaces of the piezoelectric resonator plate, excitation electrodes are formed. The first sealing member and the second sealing member are laminated and bonded via the piezoelectric resonator plate. Thus, a vibrating part (excitation electrodes) of the piezoelectric resonator plate that is disposed in the package (in the internal space) is hermetically sealed (for example, see Patent Document 1). Hereinafter, such a laminated structure of the piezoelectric resonator device is referred to as a sandwich structure.

In the piezoelectric resonator device having a sandwich structure, the piezoelectric resonator plate can be bonded to the first sealing member by diffusion bonding, and the piezoelectric resonator plate can also be bonded to the second sealing member by diffusion bonding. In the diffusion bonding, bonding patterns corresponding to bonding regions on each of the crystal plates to be bonded are formed. The bonding patterns are each formed by the following steps: forming a base film (for example, Ti film) on the crystal plate; and laminating a bonding film (Au film) on the base film. Then, the crystal plates are subjected to diffusion bonding by superimposing one crystal plate on the other crystal plate, both having the bonding patterns. Thus, the bonding patterns formed respectively on the crystal plates are bonded to each other to form laminated bonding patterns between the crystal plates.

PRIOR ART DOCUMENT

Patent Document

[Patent Document] WO 2018/051800

SUMMARY OF THE INVENTION

Problem to Be Solved by the Invention

A piezoelectric resonator device is naturally used in a state in which various electronic components are mounted. It was confirmed, by the inventor of the present invention, that corrosion of a Ti film as a base film is sometimes generated when a piezoelectric resonator device after mounting is used in a high-temperature and high-humidity environment. Also, such corrosion of a Ti film does not occur when a piezoelectric resonator device before mounting is simply stored in a high-temperature and high-humidity environment. Furthermore, the corrosion of the Ti film is not generated all over the Ti film, but is likely to be generated in a region adjacent to a narrow gap between bonding pattern layers. In view of the above, the corrosion of the Ti film is likely to occur by the process described below.

Figure 9:
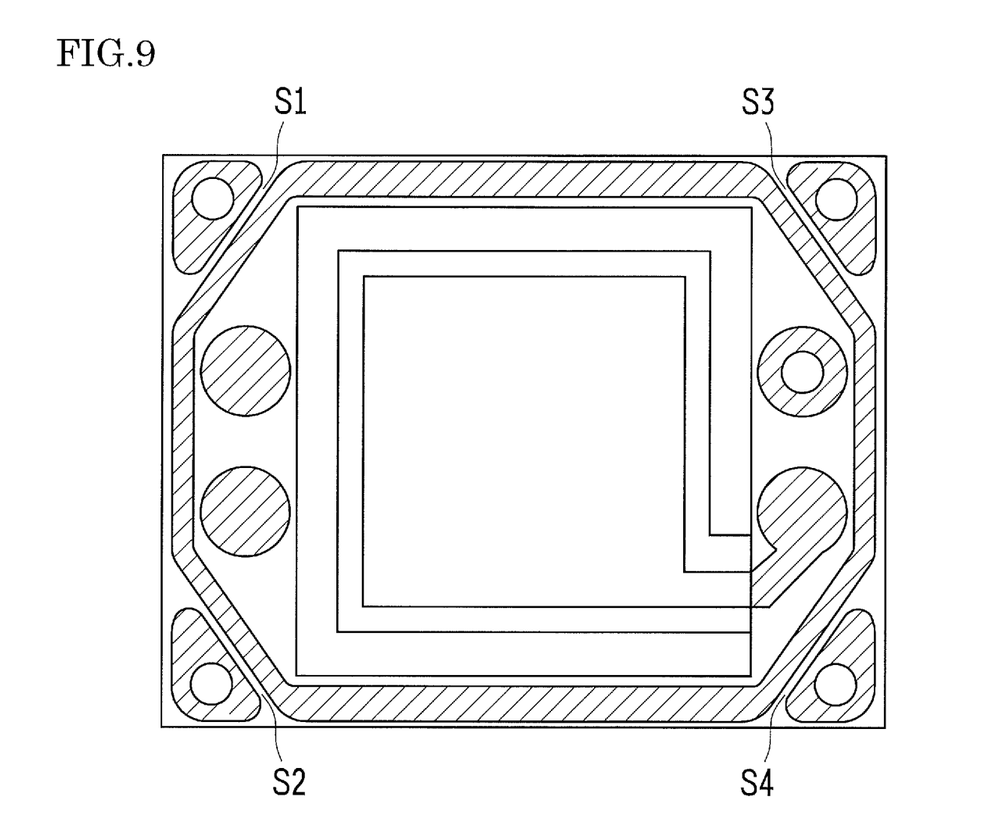
FIG. 9 is a schematic plan view of a first main surface of a piezoelectric resonator plate of a conventional piezoelectric resonator device.

FIG. 9 is a diagram exemplarily illustrating bonding patterns of a first main surface of a piezoelectric resonator plate before bonding, in a conventional piezoelectric resonator device in which corrosion of a Ti film is observed. In FIG. 9, bonding regions on which the bonding patterns (i.e. a Ti film and an Au film) are formed are shown by hatched lines. In some parts between these bonding patterns, narrow gaps S1 to S4 are generated. Since a first sealing member, which is bonded to the piezoelectric resonator plate, includes similar bonding pattern, laminated bonding patterns respectively having the same shape as the bonding patterns shown in FIG. 9 are formed between the piezoelectric resonator plate and the first sealing member.

Figure 10:
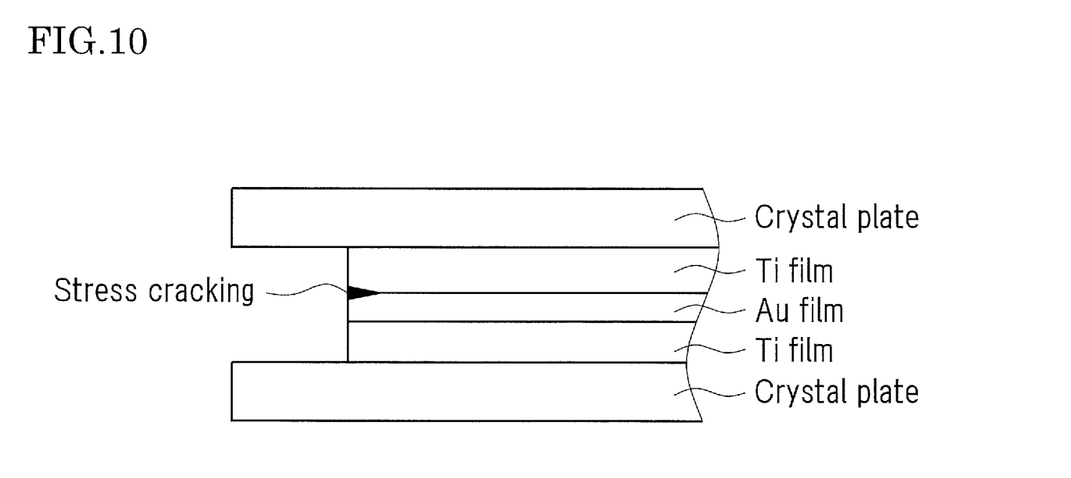
FIG. 10 is a schematic cross-sectional view indicating stress cracking generated in laminated bonding patterns between crystal plates of the conventional piezoelectric resonator device.

In the piezoelectric resonator device as a mounted circuit board, strain may be generated due to difference in the coefficient of thermal expansion and the like between the circuit board and the crystal plate, which may cause a warp of the piezoelectric resonator device. Furthermore, this strain causes peeling stress to the laminated bonding pattern of the piezoelectric resonator device. As a result, stress cracking is generated as shown in FIG. 10. FIG. 10 shows, as an example, a case in which the stress cracking is generated between the Ti film and the Au film. However, the stress cracking may be generated between the crystal plate and the Ti film. When the Ti film is exposed due to the stress cracking, the surface of the exposed Ti film is oxidized to be a Ti oxide film. Normally, the Ti oxide film on the surface serves as a barrier for preventing corrosion of the Ti film from spreading.

However, when the stress cracking is generated in the region adjacent to the gaps S1 to S4, the oxygen concentration in the gaps S1 to S4 decreases as the oxygen in moisture is consumed for oxidation of the Ti film, because convection/diffusion of moisture-containing air (atmosphere) is not likely to occur in the gaps S1 to S4. As a result, the oxygen concentration in moisture is different between the gaps S1 to S4 and the outside of the device, which leads to formation of an oxygen concentration cell. In this case, the space in the gaps S1 to S4 is the anode and the outside of the device is the cathode.

When the electric potential in the gaps S1 to S4 decreases due to formation of the oxygen concentration cell, Ti begins to hydrolyze. When the hydrolysis progresses, pH decreases due to increase of H+ and reaches the depassivation pH. When further stress cracking occurs in the above condition, the corrosion exponentially progresses without any Ti oxide film being formed on the surface of the exposed Ti film. Also, in the high-temperature and high-humidity environment, Cl− may exist in the moisture-containing air. In this case, if Cl− is attracted to the gaps S1 to S4 to maintain electrical neutrality in the gaps S1 to S4, the corrosion is further accelerated.

The present invention was made in consideration of the above circumstances, an object of which is to provide a piezoelectric resonator device having a sandwich structure, which is capable of providing corrosion of a Ti film when the device is mounted as a circuit board.

Means for Solving the Problem

In order to solve the above problem, the present invention provides a piezoelectric resonator device that includes: a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and by bonding the second sealing member to the piezoelectric resonator plate. Thus, the internal space hermetically seals a vibrating part including the first excitation electrode and the second excitation electrode of the piezoelectric resonator plate. The first sealing member and the second sealing member are respectively bonded to the piezoelectric resonator plate, both via laminated bonding patterns each constituted of a laminated film including at least a base film that is made of Ti and a bonding film that is made of Au and is formed on the base film. The laminated bonding patterns include a laminated sealing pattern that is annularly formed and surrounds the vibrating part in plan view so as to hermetically seal the internal space, and a laminated conductive pattern that establishes conduction between wiring and electrodes. The laminated conductive pattern is disposed within a closed space surrounded by the laminated sealing pattern. GND potential is applied to the laminated sealing pattern when the piezoelectric resonator device operates.

With the configuration as described above, the laminated conductive pattern included in the laminated bonding patterns is disposed within the closed space surrounded by the laminated sealing patterns. Therefore, even when a narrow gap is generated between the laminated conductive pattern and the laminated sealing pattern, this gap does not communicate with the outside. Since the closed space is hermetically sealed, no water enters even when the piezoelectric resonator device is placed in a high-temperature and high-humidity environment, and furthermore no electrical conduction occurs between the conductive pattern and the sealing pattern. Thus, it is possible to prevent an oxygen concentration cell from being formed in a gap between the laminated conductive pattern and the laminated sealing pattern. That is, even when any stress cracking is generated in the laminated sealing pattern or in the laminated conductive pattern as shown in FIG. 10 when making the crystal oscillator 101 as a mounted circuit board, it is possible to prevent corrosion of the Ti film in the laminated bonding patterns in the crystal oscillator 101 as a mounted circuit board, because no oxygen concentration cell is formed. Thus, the reliability of the crystal oscillator 101 can be ensured.

Furthermore, in the piezoelectric resonator device as a mounted circuit board, the GND potential is applied to the laminated sealing pattern, which contributes to cathodic protection of the laminated sealing pattern. Accordingly, it is possible to further reliably prevent the corrosion of the Ti film.

In the piezoelectric resonator device as described above, the laminated sealing pattern may be connected to the laminated conductive pattern to which the GND potential is applied when the piezoelectric resonator device operates.

In the piezoelectric resonator device as described above, the laminated sealing pattern may also serve as the laminated conductive pattern to which the GND potential is applied when the piezoelectric resonator device operates.

Effect of the Invention

In the piezoelectric resonator device of the present invention, the narrow gap to communicate with the outside is not generated between the laminated conductive pattern and the laminated sealing pattern. Thus, the present invention provides an effect of preventing formation of the oxygen concentration cell, and further an effect of cathodic protection by applying the GND potential to the laminated sealing pattern, which results in prevention of corrosion of the Ti film in the laminated bonding patterns.

MEANS FOR CARRYING OUT THE INVENTION

Hereinafter, an embodiment of the present invention will be described in detail with reference to the drawings. In the following embodiment, a piezoelectric resonator device to which the present invention is applied is a crystal oscillator. However, the piezoelectric resonator device of the present invention is not limited to the crystal oscillator, but includes a crystal resonator that does not have an IC chip (i.e. that is before mounting the IC chip) in the crystal oscillator described later, and also a crystal resonator that is not supposed to mount any IC chip.

Figure 1:
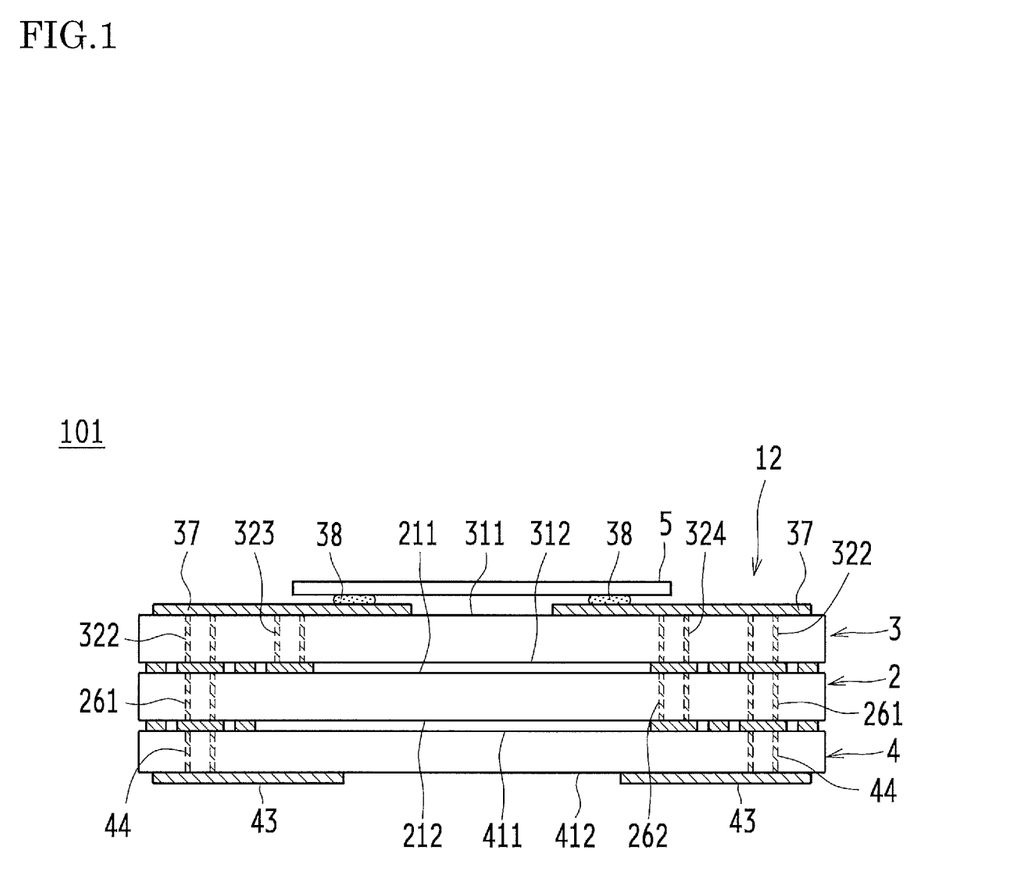
FIG. 1 is a schematic configuration diagram schematically illustrating a configuration of a crystal oscillator according to an embodiment.

As shown in FIG. 1, a crystal oscillator 101 according to this embodiment includes: a crystal resonator plate (piezoelectric resonator plate) 2; a first sealing member 3; a second sealing member 4; and an IC chip 5. In this crystal oscillator 101, the crystal resonator plate 2 is bonded to the first sealing member 3, and furthermore the crystal resonator plate 2 is bonded to the second sealing member 4. Thus, a package 12 having a sandwich structure is formed so as to have a substantially rectangular parallelepiped shape. More specifically, bonding patterns formed on the crystal resonator plate 2 and bonding patterns formed on the first sealing member 3 are subjected to diffusion bonding so as to form laminated bonding patterns between the crystal resonator plate 2 and the first sealing member 3, by which the crystal resonator plate 2 and the first sealing member 3 are bonded. In the same way, bonding patterns formed on the crystal resonator plate 2 and bonding patterns formed on the second sealing member 4 are subjected to the diffusion bonding so as to form laminated bonding patterns between the crystal resonator plate 2 and the second sealing member 4, by which the crystal resonator plate 2 and the second sealing member 4 are bonded.

Also, the IC chip 5 is mounted on a main surface of the first sealing member 3 so as to be opposed to a surface bonded to the crystal resonator plate 2. The IC chip 5 as an electronic component element is a one-chip integrated circuit element constituting, with the crystal resonator plate 2, an oscillation circuit.

In the crystal resonator plate 2, a first excitation electrode 221 is formed on a first main surface 211 as one main surface while a second excitation electrode 222 is formed on a second main surface 212 as the other main surface. In the crystal oscillator 101, the first sealing member 3 and the second sealing member 4 are bonded respectively to the first main surface 211 and the second main surface 212 of the crystal resonator plate 2, thus an internal space of the package 12 is formed. In this internal space, a vibrating part 22 (see FIGS. 4 and 5) including the first excitation electrode 221 and the second excitation electrode 222 is hermetically sealed.

The crystal oscillator 101 according to this embodiment has, for example, a package size of 1.0×0.8 mm, which is reduced in size and height. According to the size reduction, no castellation is formed in the package 12. Through holes (described later) are used for conduction between electrodes.

Next, the respective components of the above-described crystal oscillator 101 (i.e. the crystal resonator plate 2, the first sealing member 3 and the second sealing member 4) will be described referring to FIGS. 1 to 7. Here, each of the components will be described as a single body without being bonded.

Figure 4:
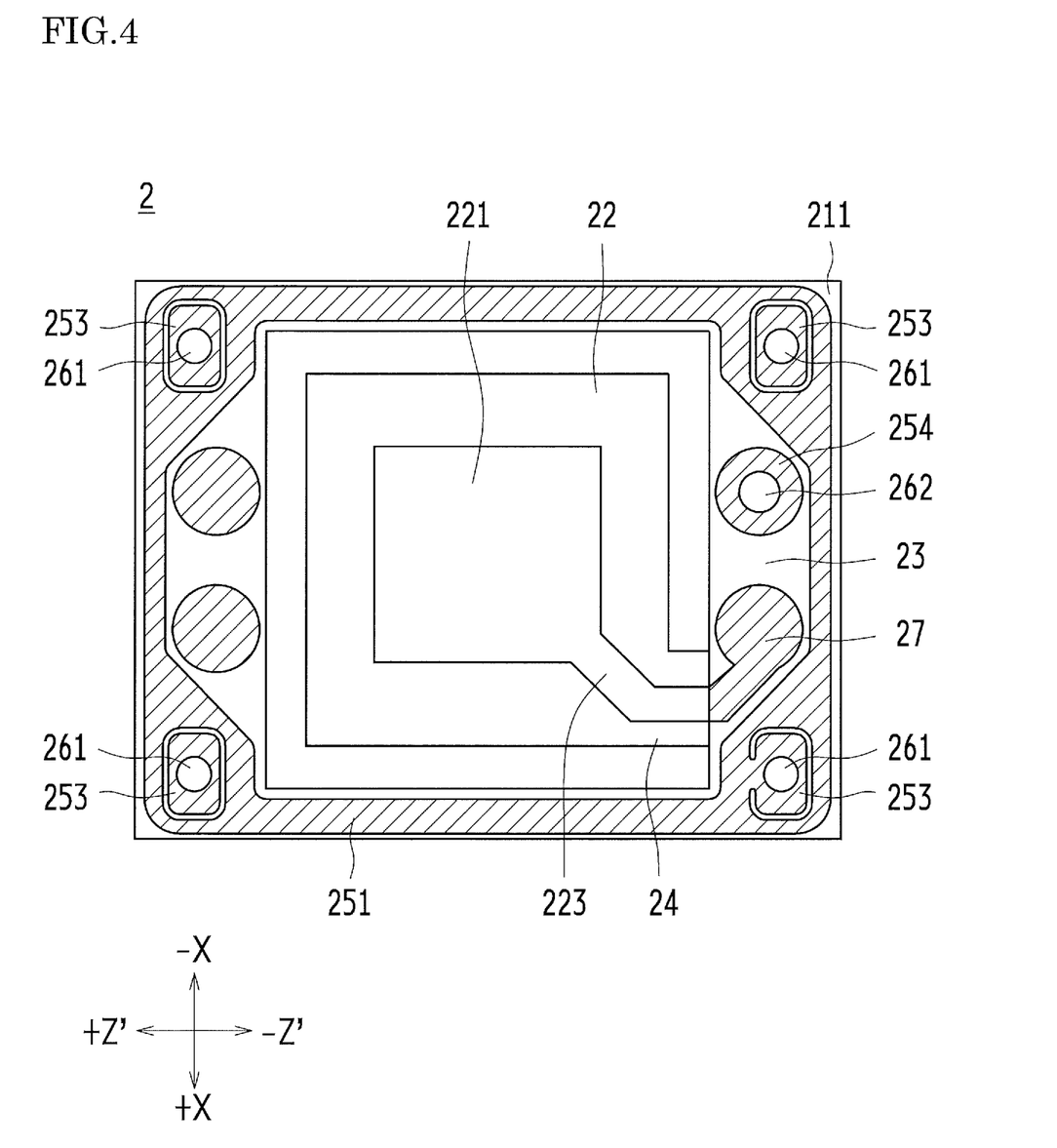
FIG. 4 is a schematic plan view illustrating a first main surface of a crystal resonator plate of the crystal oscillator.
Figure 5:
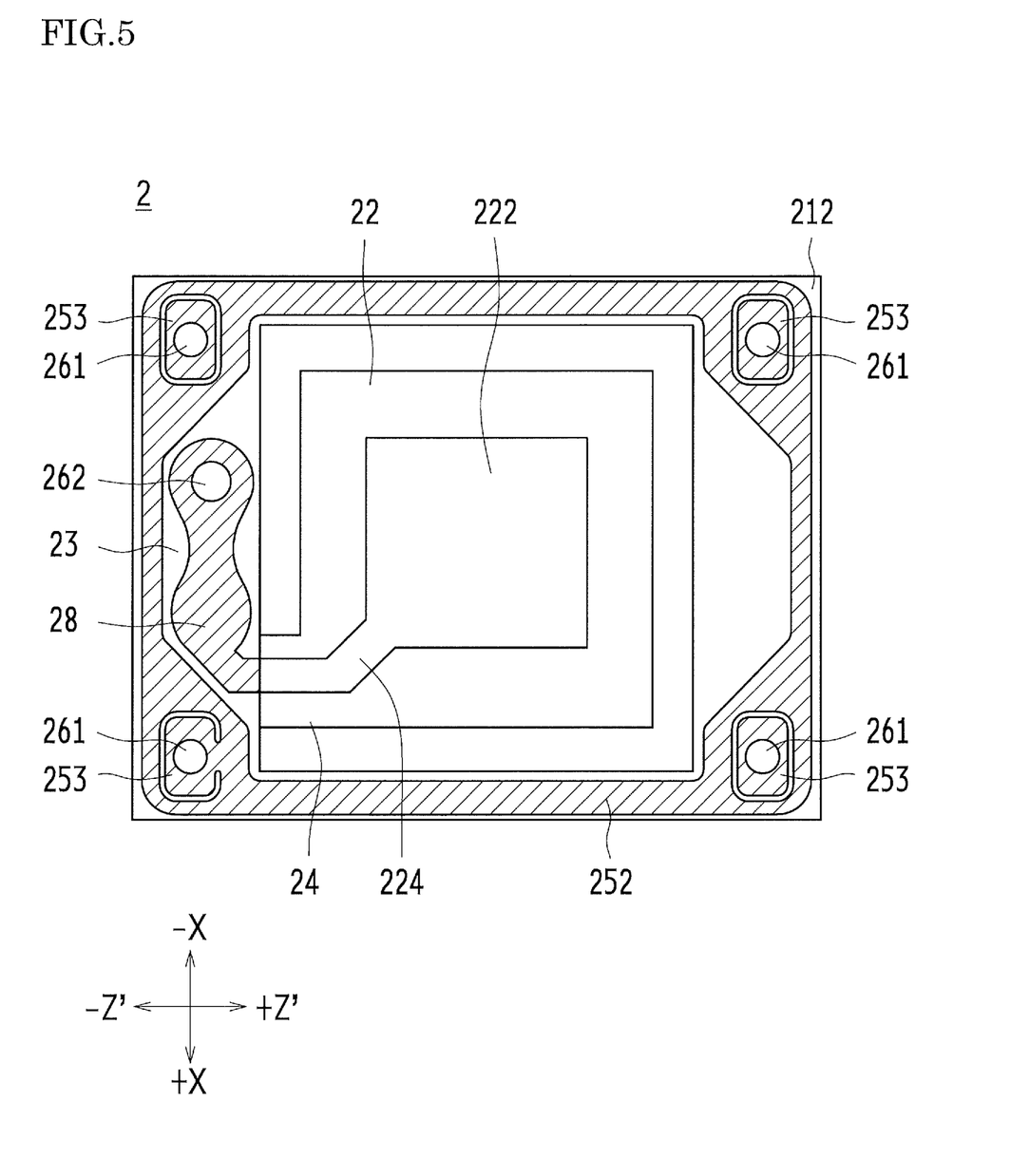
FIG. 5 is a schematic plan view illustrating a second main surface of the crystal resonator plate of the crystal oscillator.

The crystal resonator plate 2 is a piezoelectric substrate made of crystal as shown in FIGS. 4 and 5. Both main surfaces (i.e. the first main surface 211 and the second main surface 212) are formed as smooth flat surfaces (mirror-finished). In this embodiment, an AT-cut crystal plate that causes thickness shear vibration is used as the crystal resonator plate 2. In the crystal resonator plate 2 shown in FIGS. 4 and 5, each of the main surfaces (i.e. the first main surface 211 and the second main surface 212) of the crystal resonator plate 2 is an XZ' plane. On this XZ' plane, the direction parallel to the lateral direction (short side direction) of the crystal resonator plate 2 is the X axis direction, and the direction parallel to the longitudinal direction (long side direction) of the crystal resonator plate 2 is the Z' axis direction. The AT-cut method is a processing method in which a crystal plate is cut out of synthetic quartz crystal at an angle tilted by 35° 15' about the X axis from the Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the directions in which the AT-cut crystal is cut out.

A pair of excitation electrodes (i.e. the first excitation electrode 221 and the second excitation electrode 222) is formed, respectively, on the first main surface 211 and the second main surface 212 of the crystal resonator plate 2. The crystal resonator plate 2 includes: the vibrating part 22 formed so as to have a substantially rectangular shape; an external frame part 23 surrounding the outer periphery of the vibrating part 22; and a support part 24 that supports the vibrating part 22 by connecting the vibrating part 22 to the external frame part 23. That is, the crystal resonator plate 2 has a configuration in which the vibrating part 22, the external frame part 23 and the support part 24 are integrally formed.

In this embodiment, the support part 24 is provided at only one position between the vibrating part 22 and the external frame part 23. The vibrating part 22 and the support part 24 each have a thickness less than a thickness of the external frame part 23. Due to the difference in thickness between the external frame part 23 and the support part 24, the natural frequency of piezoelectric vibration differs between the external frame part 23 and the support part 24. Thus, the external frame part 23 is not likely to resonate with the piezoelectric vibration of the support part 24. The support part 24 is not necessarily formed at one part. The support part 24 may be formed at each of two parts between the vibrating part 22 and the external frame part 23.

The first excitation electrode 221 is provided on the first main surface 211 side of the vibrating part 22 while the second excitation electrode 222 is provided on the second main surface 212 side of the vibrating part 22. The first excitation electrode 221 and the second excitation electrode 222 are respectively connected to lead-out wirings (a first lead-out wiring 223 and a second lead-out wiring 224) so that these excitation electrodes are connected to external electrode terminals. The first lead-out wiring 223 is drawn from the first excitation electrode 221 and connected to a connection bonding pattern 27 formed on the external frame part 23 via the support part 24. The second lead-out wiring 224 is drawn from the second excitation electrode 222 and connected to a connection bonding pattern 28 formed on the external frame part 23 via the support part 24. Thus, the first lead-out wiring 223 is formed on the first main surface 211 side of the support part 24 while the second lead-out wiring 224 is formed on the second main surface 212 side of the support part 24.

Bonding patterns to bond the crystal resonator plate 2 respectively to the first sealing member 3 and the second sealing member 4 are provided on the first main surface 211 and the second main surface 212 of the crystal resonator plate 2. Each bonding pattern is a laminated film including a base film having excellent adhesion to crystal and a bonding film formed on the base film. Here, the base film is made of Ti and the bonding film is made of Au. The structure of the laminated film that forms the bonding pattern is not limited to a two-layer structure formed by the Ti film and the Au film. The bonding pattern may have a three or more-layer structure including another film (for example, a barrier film formed between the Ti film and the Au film).

The bonding patterns include a sealing pattern to hermetically seal the internal space of the package 12 and a conductive pattern to establish conduction between wiring and electrodes. In FIGS. 3 to 6, bonding regions on which the bonding patterns are formed are shown by hatched lines.

The sealing patterns of the crystal resonator plate 2 are constituted of a resonator-plate-side first bonding pattern 251 provided on the first main surface 211 and a resonator-plate-side second bonding pattern 252 provided on the second main surface 212. The resonator-plate-side first bonding pattern 251 and the resonator-plate-side second bonding pattern 252 are each formed on the external frame part 23 so as to have an annular shape in plan view. The region inside the resonator-plate-side first bonding pattern 251 and the resonator-plate-side second bonding pattern 252 serves as a sealed region (a region to be the internal space of the package 12 after bonding). The first excitation electrode 221 and the second excitation electrode 222 are not electrically connected to the resonator-plate-side first bonding pattern 251 and the resonator-plate-side second bonding pattern 252.

The conductive patterns of the crystal resonator plate 2 are constituted of: connection bonding patterns 253 respectively disposed in the vicinity of the four corners (corner parts) of the external frame part 23 on both the first main surface 211 and the second main surface 212; a connection bonding pattern 254 and the connection bonding pattern 27 both provided on the first main surface 211; and the connection bonding pattern 28 provided on the second main surface 212. The connection bonding pattern 254, the connection bonding pattern 27 and the connection bonding pattern 28 are disposed within the sealed region by the resonator-plate-side first bonding pattern 251 or the resonator-plate-side second bonding pattern 252. Although the connection bonding patterns 253 are disposed outside the sealed region, the respective peripheries thereof are completely surrounded by the resonator-plate-side first bonding pattern 251 or the resonator-plate-side second bonding pattern 252.

Furthermore, the resonator-plate-side first bonding pattern 251 and the resonator-plate-side second bonding pattern 252 are electrically connected to one of the connection bonding patterns 253. This connection bonding pattern 253 connected to the resonator-plate-side first bonding pattern 251 and the resonator-plate-side second bonding pattern 252 serves as an electrode to which the GND potential is applied when the crystal oscillator 101 operates.

First through holes 261 are respectively formed in the internal regions on the connection bonding patterns 253. A second through hole 262 is formed in the internal region on the connection bonding pattern 254 and the connection bonding pattern 28. The second through hole 262 is disposed in the external frame part 23, on one side in the Z' axis direction relative to the vibrating part 22 (in FIGS. 4 and 5, on the side in the +Z' direction).

In the first through holes 261 and the second through hole 262, through electrodes are respectively formed along a corresponding inner wall surface of the above through holes so as to establish conduction between the electrodes formed on the first main surface 211 and the second main surface 212. Respective central parts of the first through holes 261 and the second through hole 262 are hollow through parts penetrating between the first main surface 211 and the second main surface 212.

In the crystal resonator plate 2, it is possible to form the following elements by the same process: the first excitation electrode 221; the second excitation electrode 222; the first lead-out wiring 223; the second lead-out wiring 224, the resonator-plate-side first bonding pattern 251; the resonator-plate-side second bonding pattern 252; and the connection bonding patterns 253, 254, 27 and 28. Specifically, each of them can be formed by: a base film (Ti film) deposited on the main surface (the first main surface 211 or the second main surface 212) of the crystal resonator plate 2 by the physical vapor deposition; and a bonding film (Au film) deposited on the base film by the physical vapor deposition.

Figure 2:
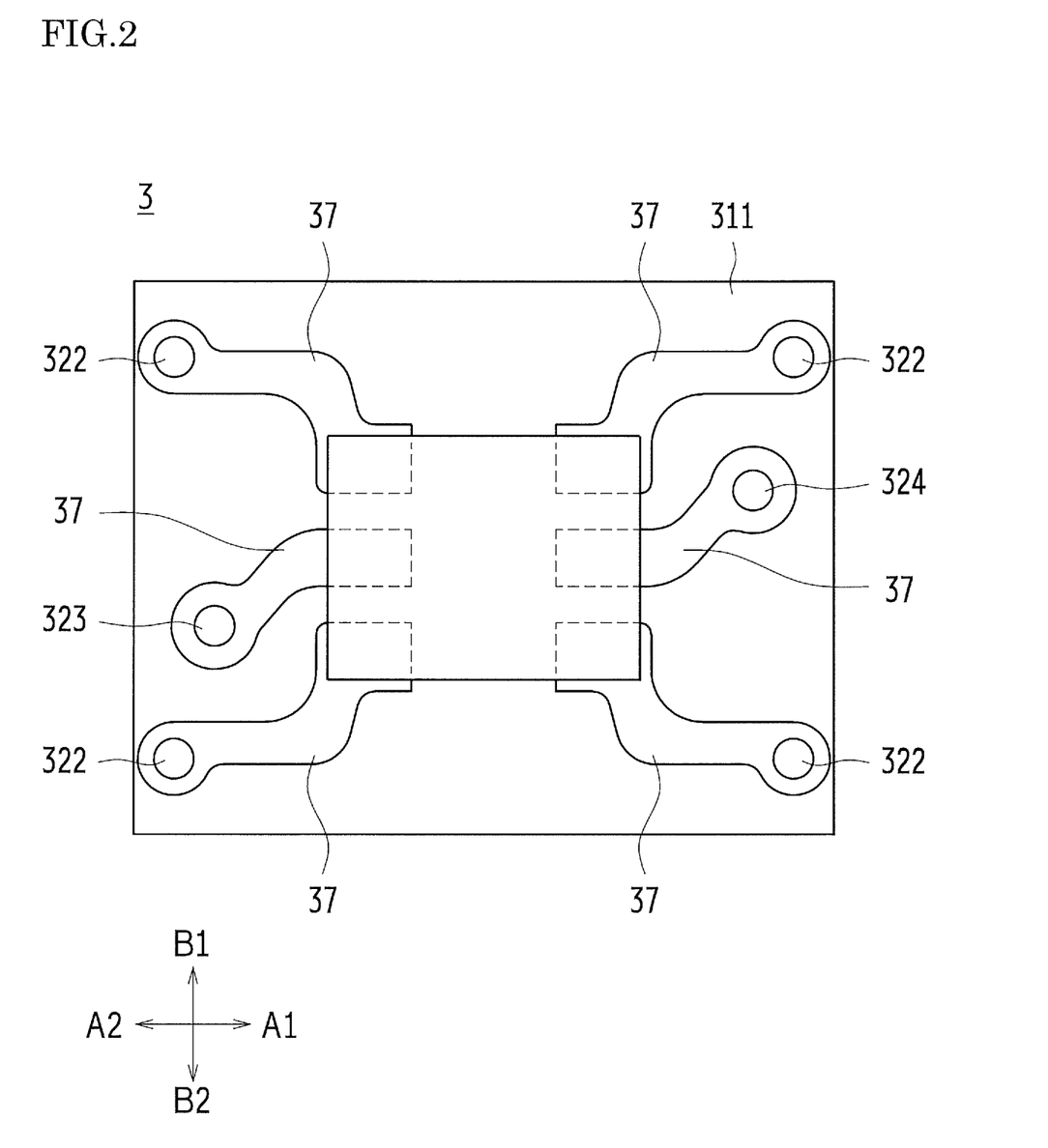
FIG. 2 is a schematic plan view illustrating a first main surface of a first sealing member of the crystal oscillator.
Figure 3:
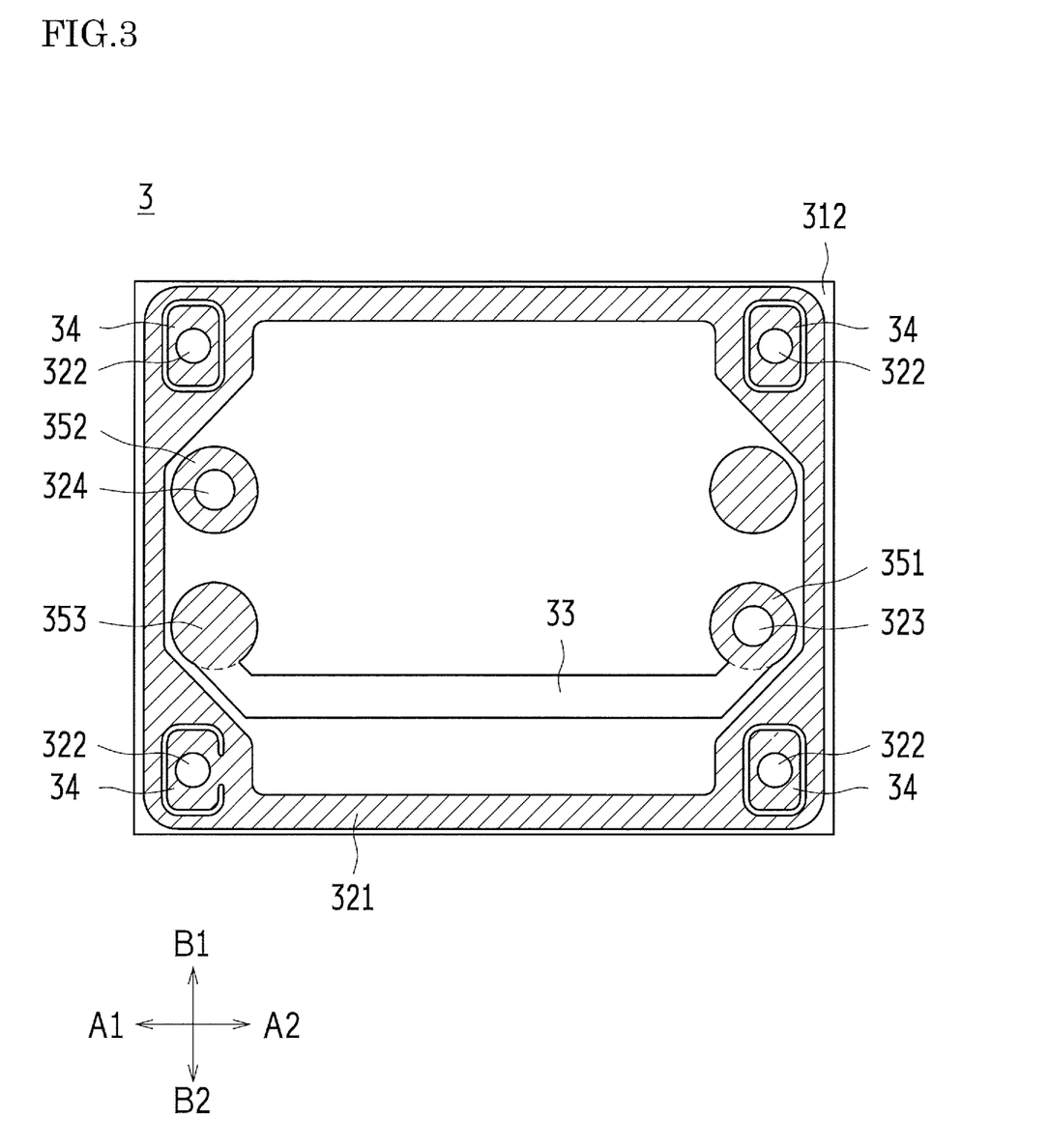
FIG. 3 is a schematic plan view illustrating a second main surface of the first sealing member of the crystal oscillator.

As shown in FIGS. 2 and 3, the first sealing member 3 is a substrate having a rectangular parallelepiped shape that is made of a single glass wafer (or a crystal wafer). A second main surface 312 (a surface to be bonded to the crystal resonator plate 2) of the first sealing member 3 is formed as a smooth flat surface (mirror finished).

As shown in FIG. 2, on a first main surface 311 (the surface on which the IC chip 5 is mounted) of the first sealing member 3, six electrode patterns 37 are formed, which include mounting pads for mounting the IC chip 5 as an oscillation circuit element. The IC chip 5 is bonded to the electrode patterns 37 by the flip chip bonding (FCB) method using a metal bump (for example, Au bump) 38 (see FIG. 1).

As shown in FIGS. 2 and 3, six through holes are formed in the first sealing member 3 so as to be respectively connected to the six electrode patterns 37 and also to penetrate between the first main surface 311 and the second main surface 312. More specifically, four third through holes 322 are respectively disposed in the four corners (corner parts) of the first sealing member 3. Fourth and fifth through holes 323 and 324 are disposed respectively in the A2 direction and in the A1 direction in FIGS. 2 and 3. The A1 direction and the A2 direction in FIGS. 2, 3, 6 and 7 respectively correspond to the −Z' direction and the +Z' direction in FIGS. 4 and 5, and the B1 direction and B2 direction in FIGS. 2, 3, 6 and 7 respectively correspond to the −X direction and the +X direction in FIGS. 4 and 5.

In the third through holes 322 and the fourth and fifth through holes 323 and 324, through electrodes are respectively formed along a corresponding inner wall surface of the above through holes so as to establish conduction between the electrodes formed on the first main surface 311 and the second main surface 312. Respective central parts of the third through holes 322 and the fourth and fifth through holes 323 and 324 are hollow through parts penetrating between the first main surface 311 and the second main surface 312.

Bonding patterns to bond the first sealing member 3 to the crystal resonator plate 2 are provided on the second main surface 312 of the first sealing member 3. Each of these bonding patterns is also a laminated film including a base film (Ti film) having excellent adhesion to crystal and a bonding film (Au film) formed on the base film.

The sealing pattern of the first sealing member 3 is constituted of a sealing-member-side first bonding pattern 321. The sealing-member-side first bonding pattern 321 is formed so as to have an annular shape in plan view, and the region inside thereof serves as a sealed region.

The conductive patterns of the first sealing member 3 are constituted of: connection bonding patterns 34 respectively formed around the third through holes 322; a connection bonding pattern 351 formed around the fourth through hole 323; a connection bonding pattern 352 formed around the fifth through hole 324; and a connection bonding pattern 353 formed on the side opposite to the connection bonding pattern 351 in the long axis direction of the first sealing member 3 (i.e. on the side in the A2 direction). The connection bonding pattern 351 and the connection bonding pattern 353 are connected to each other via a wiring pattern 33. The connection bonding pattern 351, the connection bonding pattern 352 and the connection bonding pattern 353 are disposed within the sealed region by the sealing-member-side first bonding pattern 321. Although the connection bonding patterns 34 are disposed outside the sealed region, the respective peripheries thereof are completely surrounded by the sealing-member-side first bonding pattern 321.

Furthermore, the sealing-member-side first bonding pattern 321 is electrically connected to one of the connection bonding patterns 34. This connection bonding pattern 34 connected to the sealing-member-side first bonding pattern 321 serves as an electrode to which the GND potential is applied when the crystal oscillator 101 operates.

In the first sealing member 3, it is possible to form the following elements by the same process: the sealing-member-side first bonding pattern 321; the connection bonding patterns 34, and 351 to 353; and the wiring pattern 33. Specifically, each of them can be formed by: a base film (Ti film) deposited on the second main surface 312 of the first sealing member 3 by the physical vapor deposition; and a bonding film (Au film) deposited on the base film by the physical vapor deposition.

Figure 6:
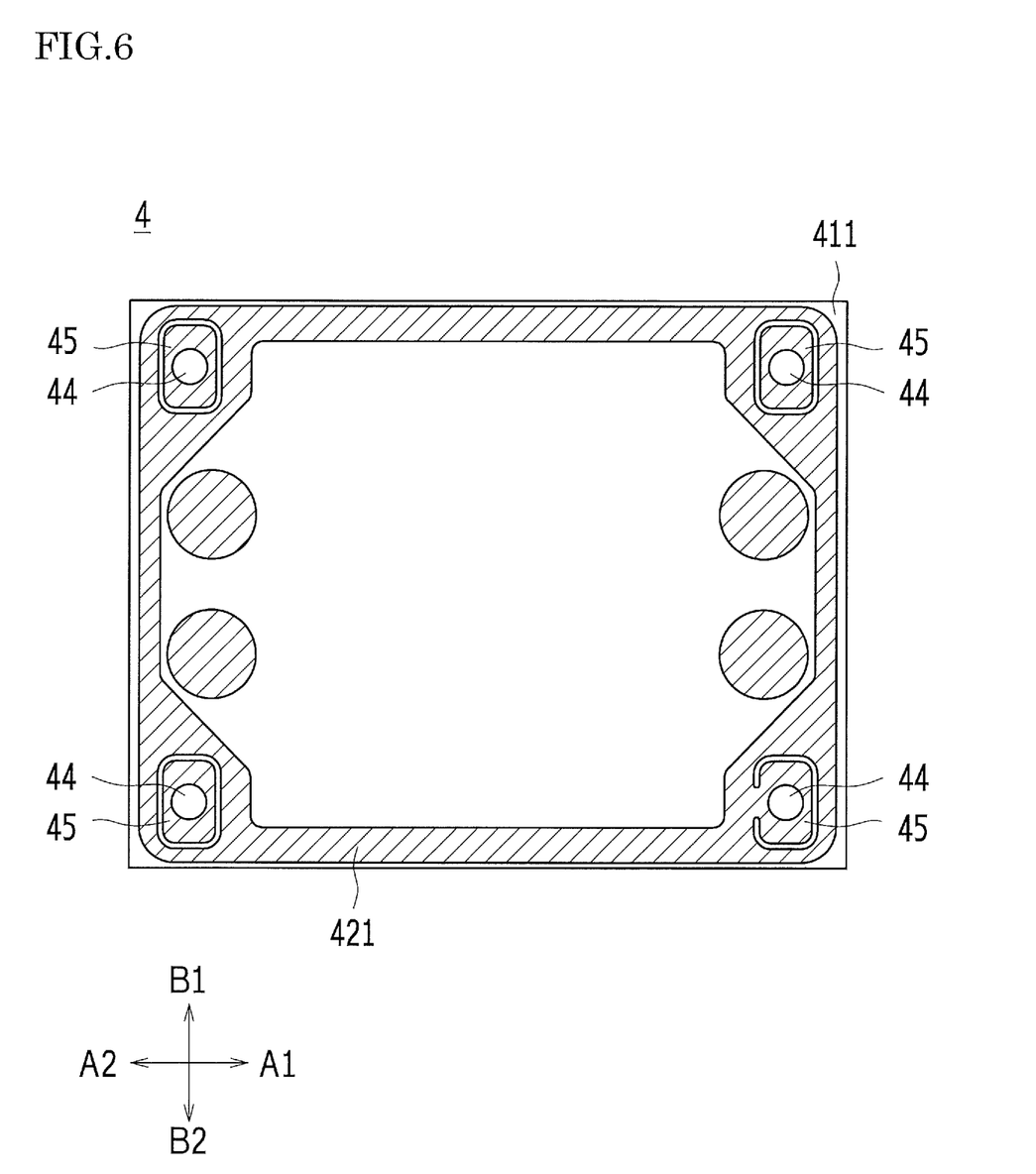
FIG. 6 is a schematic plan view illustrating a first main surface of a second sealing member of the crystal oscillator.
Figure 7:
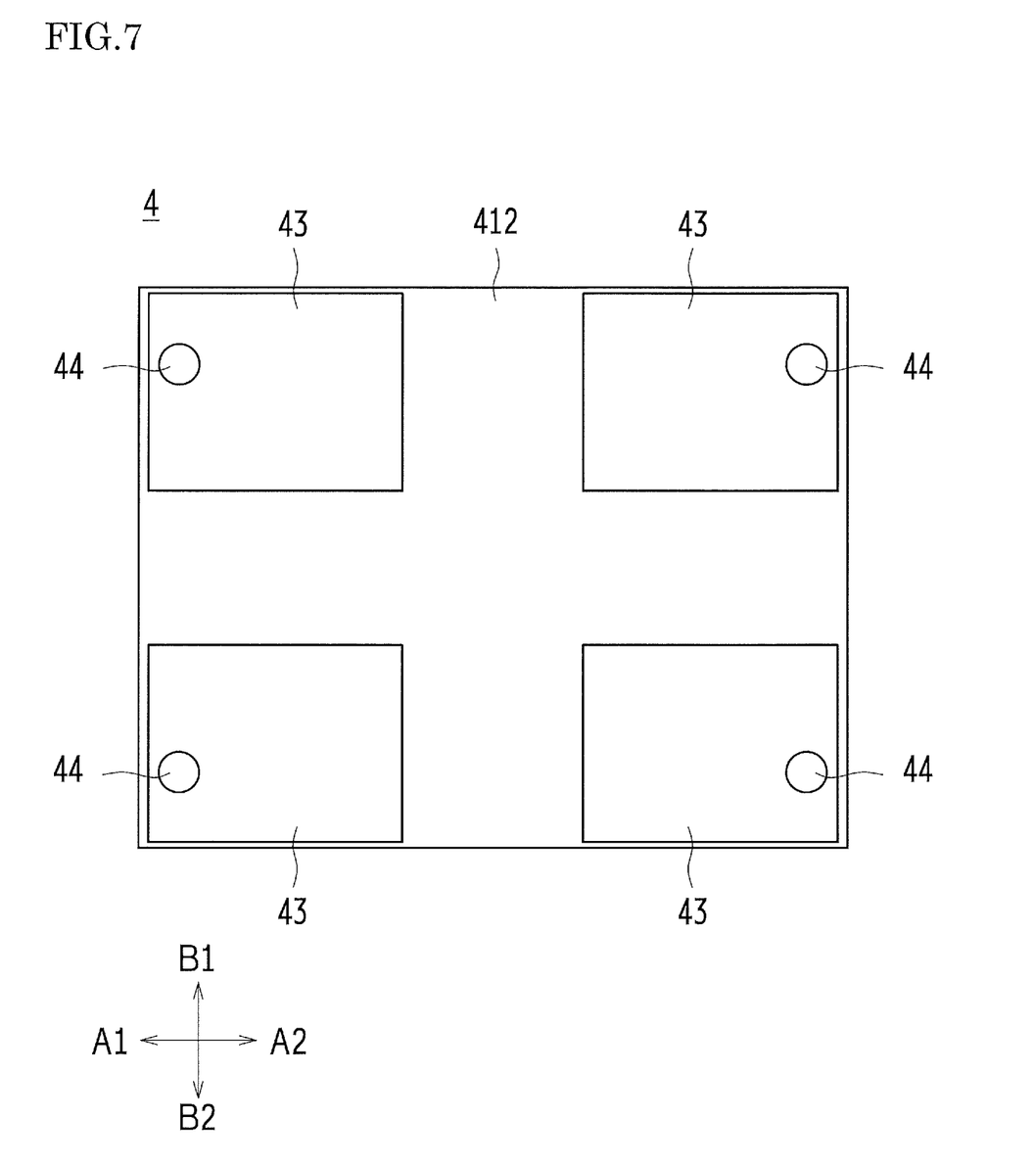
FIG. 7 is a schematic plan view illustrating a second main surface of the second sealing member of the crystal oscillator.

As shown in FIGS. 6 and 7, the second sealing member 4 is a substrate having a rectangular parallelepiped shape that is made of a single glass wafer (or a crystal wafer). A first main surface 411 (a surface to be bonded to the crystal resonator plate 2) of the second sealing member 4 is formed as a smooth flat surface (mirror finished).

Four external electrode terminals 43, which are electrically connected to the outside, are formed on a second main surface 412 (the outer main surface not facing the crystal resonator plate 2) of the second sealing member 4. The external electrode terminals 43 are respectively located at four corners (corner parts) of the second sealing member 4.

As shown in FIGS. 6 and 7, four through holes are formed in the second sealing member 4 so as to penetrate between the first main surface 411 and the second main surface 412. More specifically, four sixth through holes 44 are respectively disposed in the four corners (corner parts) of the second sealing member 4. In the sixth through holes 44, through electrodes are respectively formed along a corresponding inner wall surface of the above through holes so as to establish conduction between the electrodes formed on the first main surface 411 and the second main surface 412. Respective central parts of the sixth through holes 44 are hollow through parts penetrating between the first main surface 411 and the second main surface 412.

Bonding patterns to bond the second sealing member 4 to the crystal resonator plate 2 are provided on the first main surface 411 of the second sealing member 4. Each of these bonding patterns is also a laminated film including a base film (Ti film) having excellent adhesion to crystal and a bonding film (Au film) formed on the base film.

The sealing pattern of the second sealing member 4 is constituted of a sealing-member-side second bonding pattern 421. The sealing-member-side second bonding pattern 421 is formed so as to have an annular shape in plan view, and the region inside thereof serves as a sealed region.

The conductive patterns of the second sealing member 4 are constituted of connection bonding patterns 45 respectively formed around the sixth through holes 44. Although the connection bonding patterns 45 are disposed outside the sealed region, the respective peripheries thereof are completely surrounded by the sealing-member-side second bonding pattern 421.

Furthermore, the sealing-member-side second bonding pattern 421 is electrically connected to one of the connection bonding patterns 45. This connection bonding pattern 45 connected to the sealing-member-side second bonding pattern 421 serves as an electrode to which the GND potential is applied when the crystal oscillator 101 operates.

In the second sealing member 4, it is possible to form the sealing-member-side second bonding pattern 421 and the connection bonding patterns 45 by the same process. Specifically, each of them can be formed by: a base film (Ti film) deposited on the first main surface 411 of the second sealing member 4 by the physical vapor deposition; and a bonding film (Au film) deposited on the base film by the physical vapor deposition.

In the crystal oscillator 101 including the crystal resonator plate 2, the first sealing member 3 and the second sealing member 4, the crystal resonator plate 2 and the first sealing member 3 are subjected to the diffusion bonding in a state in which the resonator-plate-side first bonding pattern 251 and the sealing-member-side first bonding pattern 321 (sealing patterns) are superimposed on each other, and the crystal resonator plate 2 and the second sealing member 4 are subjected to the diffusion bonding in a state in which the resonator-plate-side second bonding pattern 252 and the sealing-member-side second bonding pattern 421 (sealing patterns) are superimposed on each other, thus, the package 12 having the sandwich structure shown in FIG. 1 is produced. In other words, the resonator-plate-side first bonding pattern 251 and the sealing-member-side first bonding pattern 321 are bonded to each other so as to be a laminated sealing pattern between the crystal resonator plate 2 and the first sealing member 3. The resonator-plate-side second bonding pattern 252 and the sealing-member-side second bonding pattern 421 are bonded to each other so as to be a laminated sealing pattern between the crystal resonator plate 2 and the second sealing member 4. Accordingly, the internal space of the package 12, i.e. the space to house the vibrating part 22 is hermetically sealed.

In this case, the respective connection bonding patterns as described above are also subjected to the diffusion bonding in a state in which they are each superimposed on the corresponding connection bonding pattern. Such bonding between the connection bonding patterns (conductive patterns) allows electrical conduction of the first excitation electrode 221, the second excitation electrode 222, the IC chip 5 and the external electrode terminals 43 of the crystal oscillator 101. The conductive patterns bonded to each other respectively serve as laminated conductive patterns between the crystal resonator plate 2 and the first sealing member 3, and between the crystal resonator plate 2 and the second sealing member 4.

More specifically, the first excitation electrode 221 is connected to the IC chip 5 via the first lead-out wiring 223, the laminated conductive pattern made by bonding the connection bonding pattern 27 and the connection bonding pattern 353, the wiring pattern 33, the connection bonding pattern 351, the through electrode in the fourth through hole 323, and the electrode pattern 37 in this order. The second excitation electrode 222 is connected to the IC chip 5 via the second lead-out wiring 224, the connection bonding pattern 28, the through electrode in the second through hole 262, the laminated conductive pattern made by bonding the connection bonding pattern 254 and the connection bonding pattern 352, the through electrode in the fifth through hole 324, and the electrode pattern 37 in this order. Also, the IC chip 5 is connected to the external electrode terminals 43 via the electrode patterns 37, the through electrodes in the third through holes 322, the laminated conductive patterns made by bonding the connection bonding patterns 34 and the connection bonding patterns 253, the through electrodes in the first through holes 261, the laminated conductive patterns made by bonding the connection bonding patterns 253 and the connection bonding patterns 45, and the through electrodes in the sixth through holes 44 in this order.

As shown in FIGS. 3 to 6, in the crystal oscillator 101 according to this embodiment, the laminated conductive patterns (especially the laminated conductive patterns respectively formed at the four corners outside the internal space of the package 12) are disposed within the closed space surrounded by the laminated sealing patterns. Therefore, even when a narrow gap is generated between the laminated conductive pattern and the laminated sealing pattern, this gap does not communicate with the outside.

Since the closed space is hermetically sealed, no water enters even when the device is placed in a high-temperature and high-humidity environment, and furthermore no electrical conduction occurs in the gap between the conductive pattern and the sealing pattern. Thus, it is possible to prevent an oxygen concentration cell from being formed between the laminated conductive pattern and the laminated sealing pattern. That is, even when any stress cracking is generated in the laminated sealing pattern or in the laminated conductive pattern as shown in FIG. 10 when making the crystal oscillator 101 as a mounted circuit board, it is possible to prevent corrosion of the Ti film in the laminated bonding patterns in the crystal oscillator 101 as a mounted circuit board, because no oxygen concentration cell is formed. Thus, the reliability of the crystal oscillator 101 can be ensured.

Furthermore, in the crystal oscillator 101 as a mounted circuit board, the GND potential is applied to the laminated sealing patterns, which is a configuration for cathodic protection of the laminated sealing patterns. That is, by lowering the electric potential of the Ti film in the laminated sealing patterns to the value equal to or less than the threshold value (protective potential), the corrosion of the Ti film can be further reliably prevented. Indeed, in the conventional piezoelectric resonator device in which the corrosion of the Ti film is observed, there is no corrosion of the Ti film in the laminated conductive patterns to which is applied the GND potential. Thus, cathodic protection by applying the GND potential to the laminated sealing patterns is considered to be also beneficial in the crystal oscillator 101 according to this embodiment.

Figure 8:
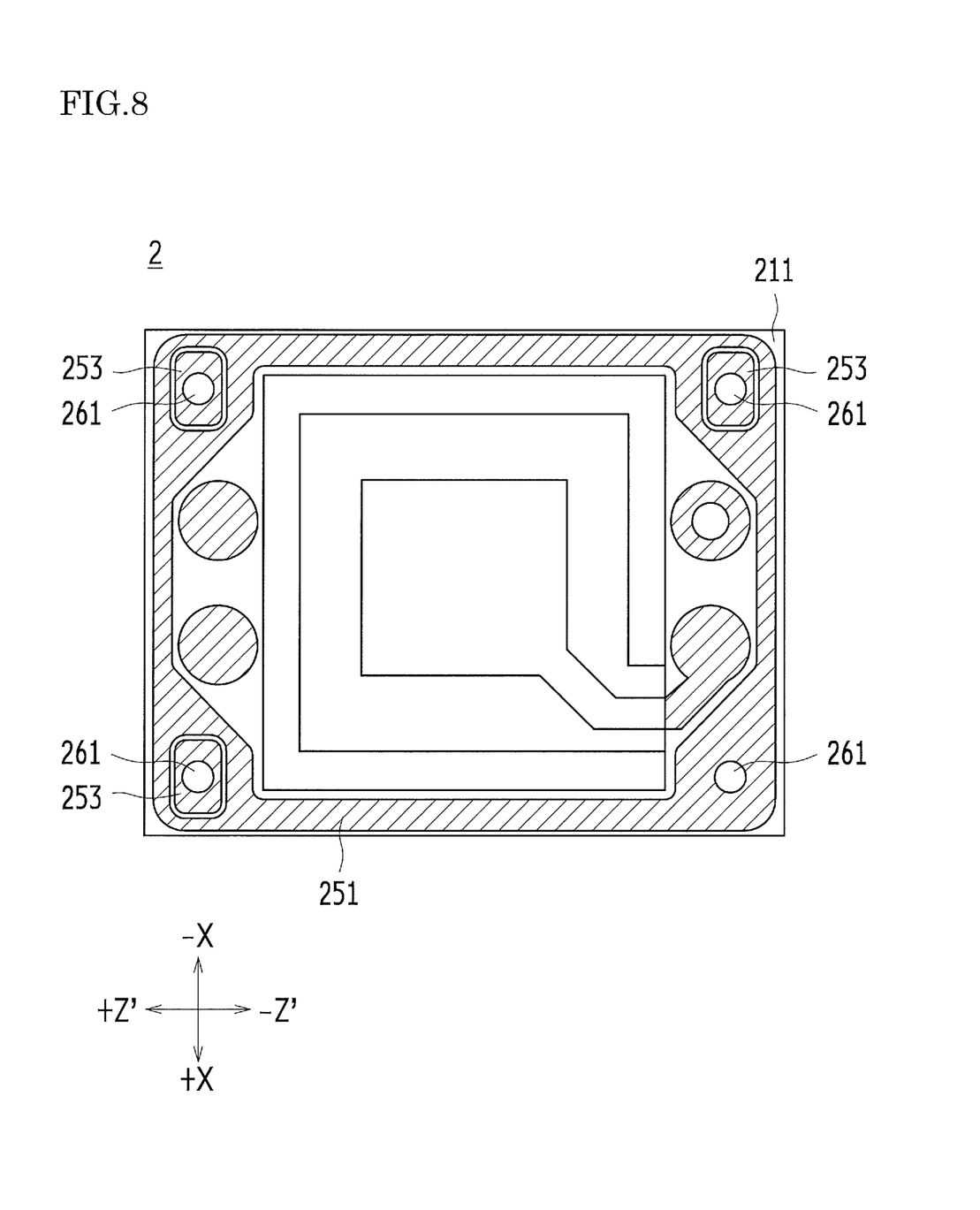
FIG. 8 is a schematic plan view of a first main surface of the crystal resonator plate, which is a variation of the crystal oscillator according to the embodiment.

In the configuration shown in FIGS. 3 to 6, the sealing patterns are connected to the respective conductive patterns to which the GND potential is applied when the crystal oscillator 101 operates. However, the present invention is not limited thereto. As shown in FIG. 8, the sealing pattern (here, the resonator-plate-side first bonding pattern 251) may also serve as the conductive pattern to which the GND potential is applied when the crystal oscillator 101 operates. Specifically, in the example shown in FIG. 8, only three of the four first through holes 261 have their respective connection bonding patterns 253 formed around them, and the remaining one of the four first through holes 261 is directly connected to the resonator-plate-side first bonding pattern 251. In FIG. 8, the first main surface 211 of the crystal resonator plate 2 is exemplarily shown. However, this configuration can be also applied to the second main surface 212 of the crystal resonator plate 2, the second main surface 312 of the first sealing member 3 and the first main surface 411 of the second sealing member 4.

The above-disclosed embodiments are to be considered in all respects as illustrative and not limiting. The technical scope of the invention is indicated by the appended claims rather than by the foregoing embodiments, and all modifications and changes that come within the meaning and range of equivalency of the claims are intended to be embraced therein.

DESCRIPTION OF REFERENCE NUMERALS

101 Crystal oscillator (Piezoelectric resonator device)
2 Crystal resonator plate (Piezoelectric resonator plate)
22 Vibrating part
23 External frame part
24 Support part
211 First main surface
212 Second main surface
221 First excitation electrode
222 Second excitation electrode
223 First lead-out wiring
224 Second lead-out wiring
251 Resonator-plate-side first bonding pattern (Part of laminated sealing pattern)
252 Resonator-plate-side second bonding pattern (Part of laminated sealing pattern)
253 Connection bonding pattern (Part of laminated conductive pattern)
254 Connection bonding pattern (Part of laminated conductive pattern)
27 Connection bonding pattern (Part of laminated conductive pattern)
28 Connection bonding pattern (Part of laminated conductive pattern)
3 First sealing member
311 First main surface
312 Second main surface
321 Sealing-member-side first bonding pattern (Part of laminated sealing pattern)
34 Connection bonding pattern (Part of laminated conductive pattern)
351 Connection bonding pattern (Part of laminated conductive pattern)
352 Connection bonding pattern (Part of laminated conductive pattern)
353 Connection bonding pattern (Part of laminated conductive pattern)
4 Second sealing member
411 First main surface
412 Second main surface
421 Sealing-member-side second bonding pattern (Part of laminated sealing pattern)
45 Connection bonding pattern (Part of laminated conductive pattern)
5 IC chip
12 Package

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein
the first sealing member and the second sealing member are respectively bonded to the piezoelectric resonator plate, both via laminated bonding patterns each constituted of a laminated film including at least a base film that is made of Ti and a bonding film that is made of Au and is formed on the base film,
each of the laminated bonding patterns includes a laminated sealing pattern that is annularly formed and surrounds the vibrating part in plan view so as to hermetically seal the internal space, and a laminated conductive pattern that establishes conduction between wiring and electrodes, the laminated conductive pattern is disposed within a closed space inside the laminated sealing pattern, the closed space being provided outside of the internal space surrounded by the laminated sealing pattern, and a GND potential is applied to the laminated sealing pattern when the piezoelectric resonator device operates.

2. The piezoelectric resonator device according to claim 1, wherein the laminated sealing pattern is connected to the laminated conductive pattern to which the GND potential is applied when the piezoelectric resonator device operates.

3. The piezoelectric resonator device according to claim 1, wherein the laminated sealing pattern also serves as the laminated conductive pattern to which the GND potential is applied when the piezoelectric resonator device operates.

* * * * *